United States Patent
Kraus et al.

(10) Patent No.: US 10,608,584 B2
(45) Date of Patent: Mar. 31, 2020

(54) FAST START-UP CIRCUIT FOR LOW POWER CRYSTAL OSCILLATOR

(71) Applicants: Shraga Kraus, Haifa (IL); Neil Feldman, Misgav (IL)

(72) Inventors: Shraga Kraus, Haifa (IL); Neil Feldman, Misgav (IL)

(73) Assignee: PLSense Ltd., Yokneam Elit (IL)

( * ) Notice: Subject to any disclaimer, the term of this patent is extended or adjusted under 35 U.S.C. 154(b) by 128 days.

(21) Appl. No.: 15/844,573

(22) Filed: Dec. 17, 2017

(65) Prior Publication Data
US 2019/0190447 A1   Jun. 20, 2019

(51) Int. Cl.
*H03B 5/06*    (2006.01)
*H03B 5/36*    (2006.01)

(52) U.S. Cl.
CPC ............. *H03B 5/06* (2013.01); *H03B 5/364* (2013.01); *H03B 2200/0008* (2013.01); *H03B 2200/0012* (2013.01); *H03B 2200/0094* (2013.01)

(58) Field of Classification Search
CPC .. H03B 5/364; H03B 5/06; H03B 2200/0094; H03B 2200/0008; H03B 2200/0012
USPC ................... 331/116 FE, 158, 185
See application file for complete search history.

(56) References Cited

U.S. PATENT DOCUMENTS

| | | | |
|---|---|---|---|
| 7,616,074 B2* | 11/2009 | Toffolon | H03L 3/00 331/158 |
| 8,729,974 B2* | 5/2014 | Zoppi | H03L 5/00 331/158 |
| 2009/0096541 A1* | 4/2009 | Tran | H03B 5/06 331/116 FE |

* cited by examiner

*Primary Examiner* — Arnold M Kinkead

(57) ABSTRACT

A method and apparatus for speeding up the start-up process of a crystal oscillator. The energy required for starting oscillations is inserted to the crystal by a stimulus in the form of a time-variant voltage or current pattern, either periodic or aperiodic. The stimulus is stopped after a pre-established period, then the oscillator continues to operate in its normal mode and completes the start-up process significantly faster, compared to a start-up process not comprising the above stimulus.

17 Claims, 12 Drawing Sheets

(Embodiment of the present invention, at which the start-up stimulus is realised as a time-variant voltage pattern)

Figure 1 (Schematic diagram of the Pierce crystal oscillator, according to prior art)
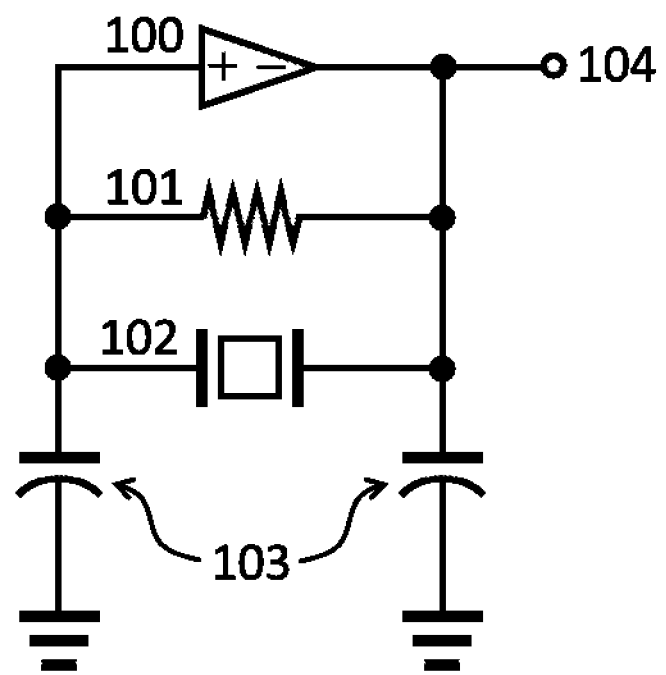

Figure 2 (Schematic diagram of the Colpitts crystal oscillator, according to prior art)
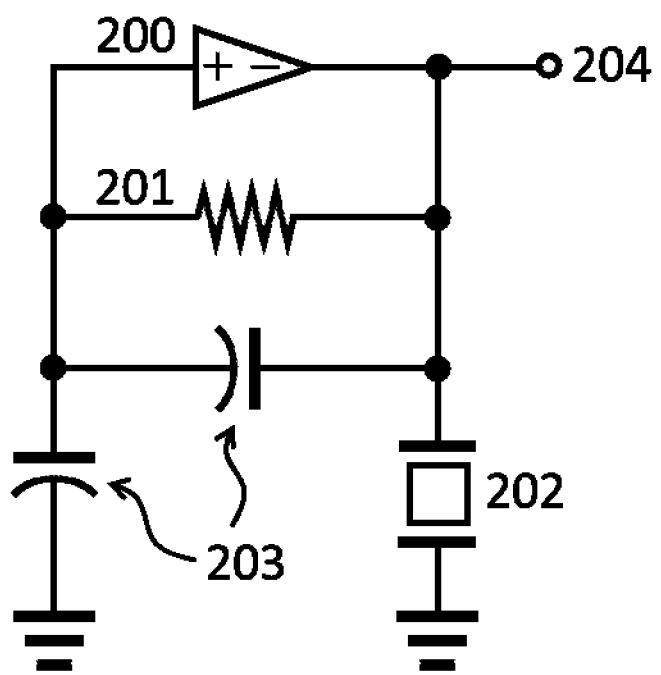

Figure 3 (Schematic diagram of the Santos crystal oscillator, according to prior art)
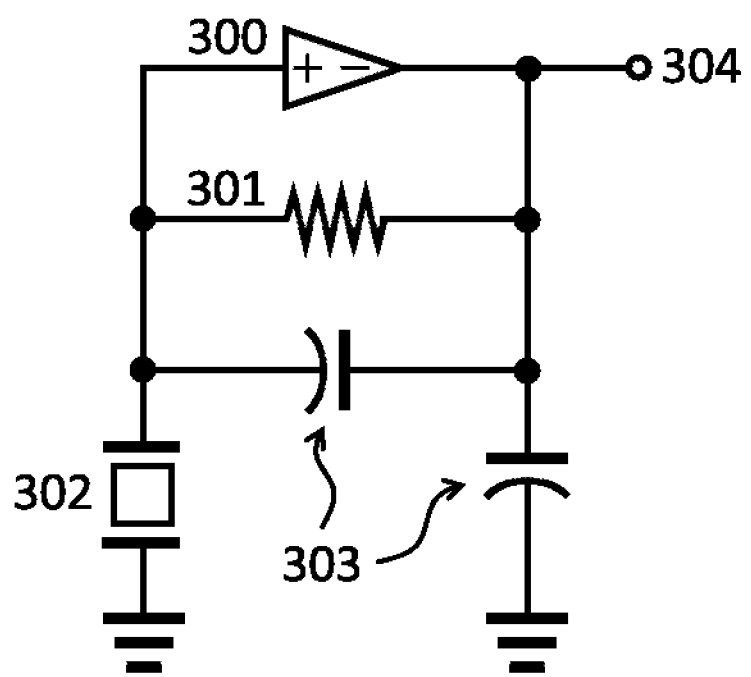

Figure 4 (Schematic diagram of a crystal oscillator comprising a start-up shortening technique, according to prior art)
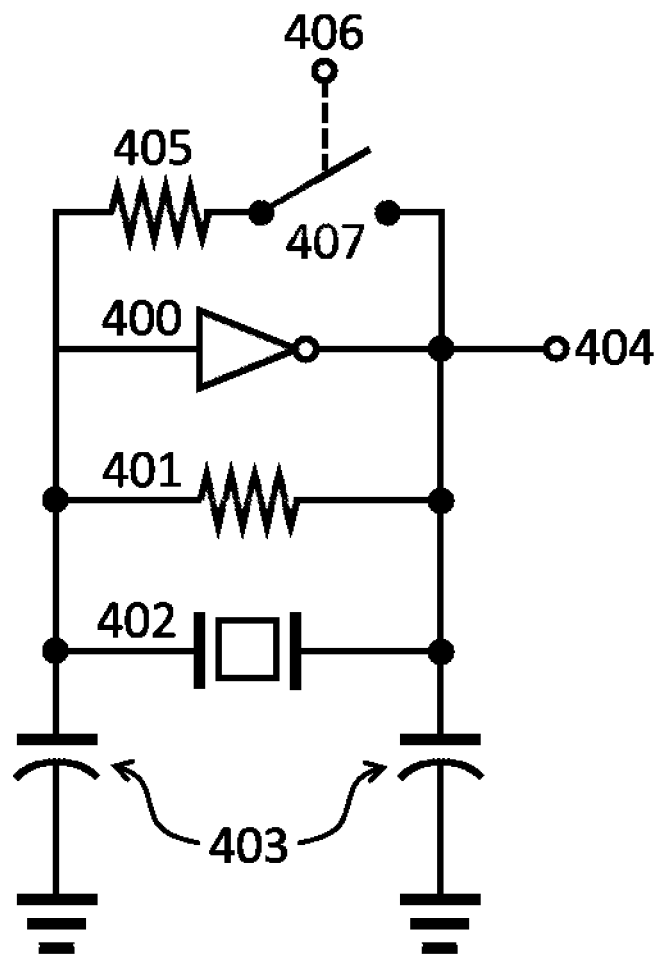

Figure 5 (Schematic diagram of an amplifier serving in a crystal oscillator comprising a start-up shortening technique, according to prior art)
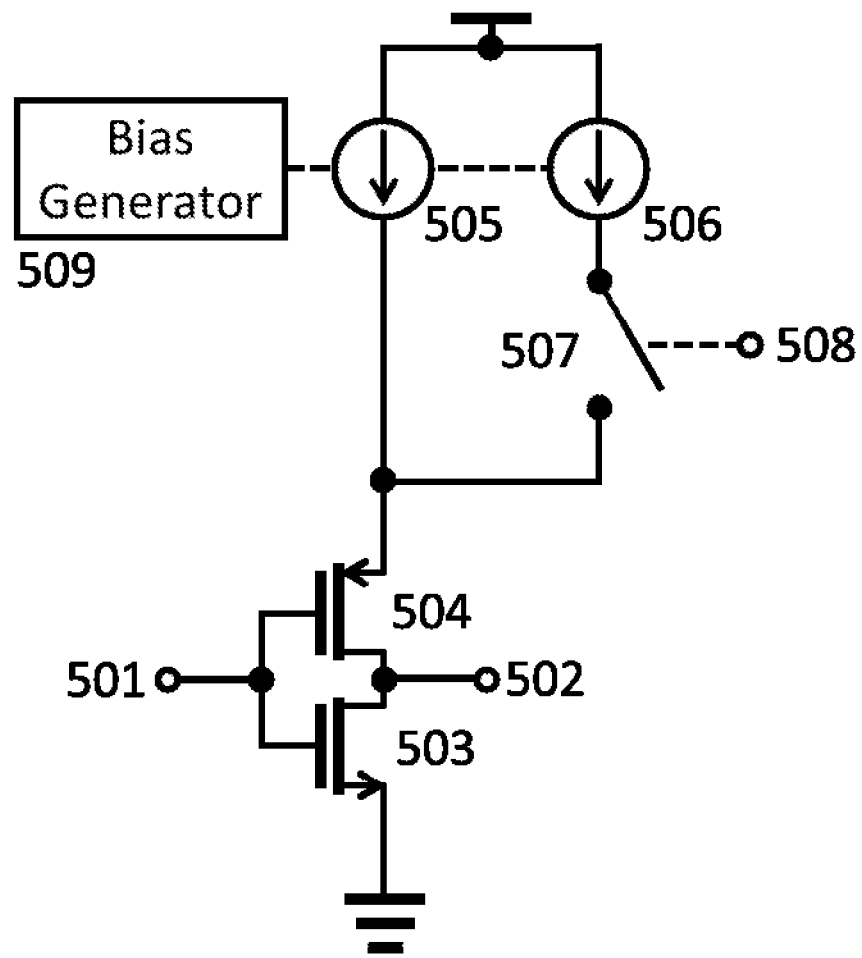

Figure 6 (Schematic diagram of a crystal oscillator comprising a start-up shortening technique, according to prior art)
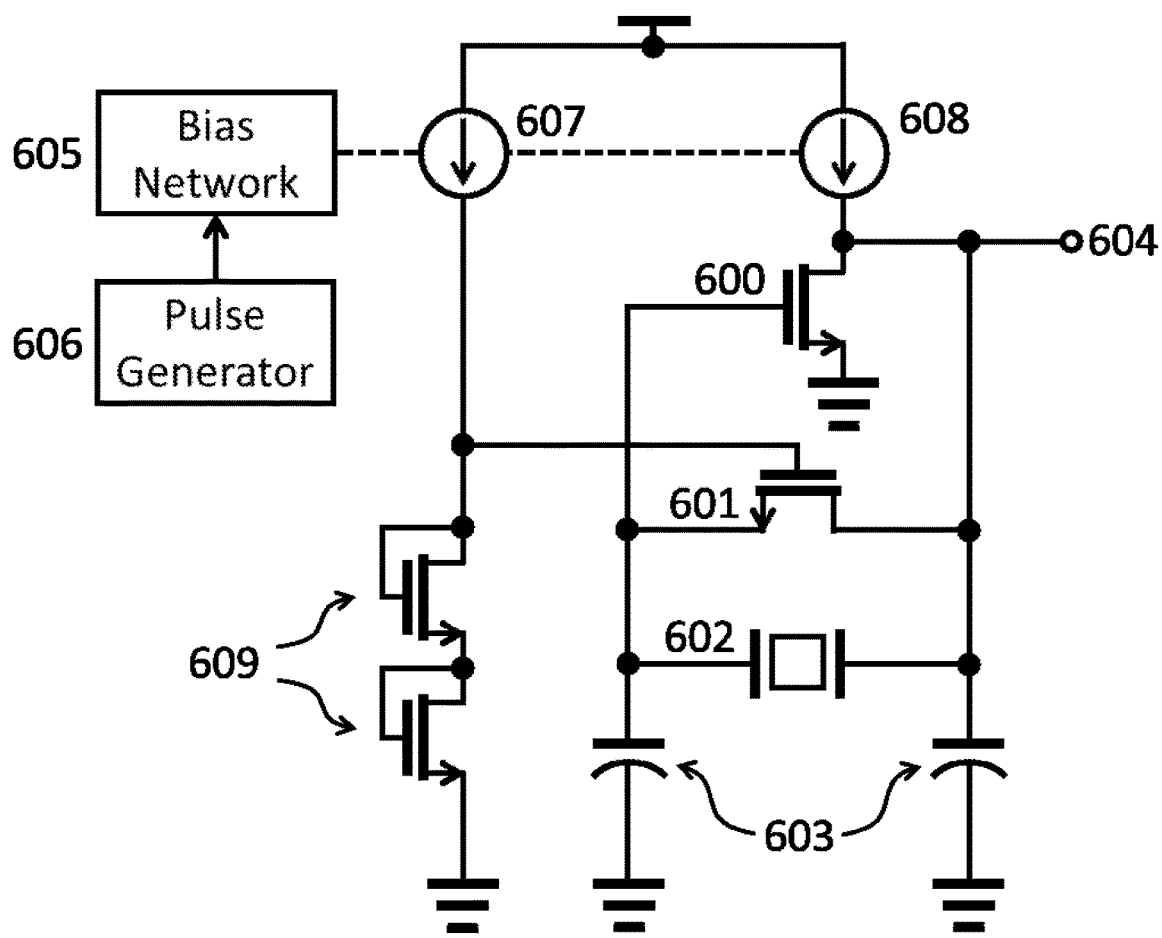

Figure 7 (Schematic diagram of a crystal oscillator comprising a start-up shortening technique, according to prior art)
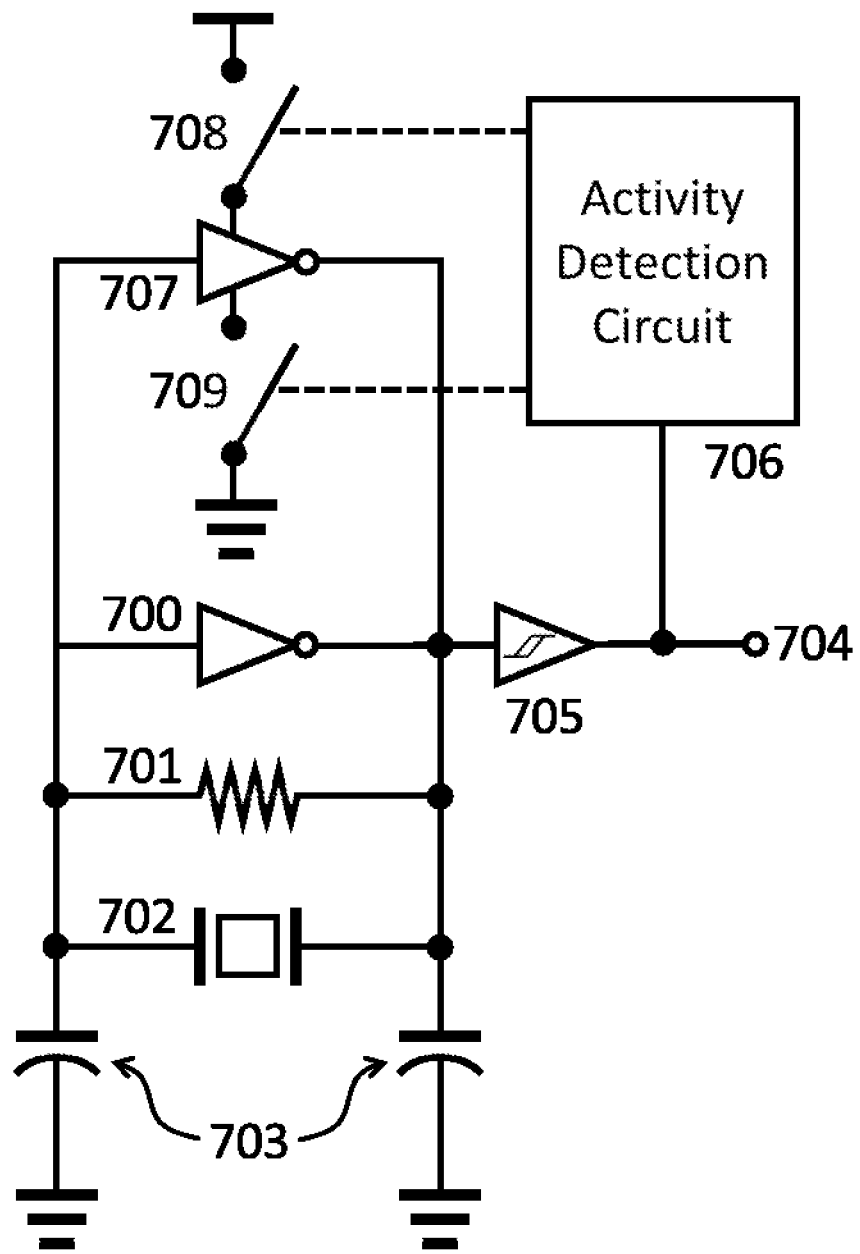

Figure 8 (Schematic diagram of a crystal oscillator comprising a start-up shortening technique, according to prior art)
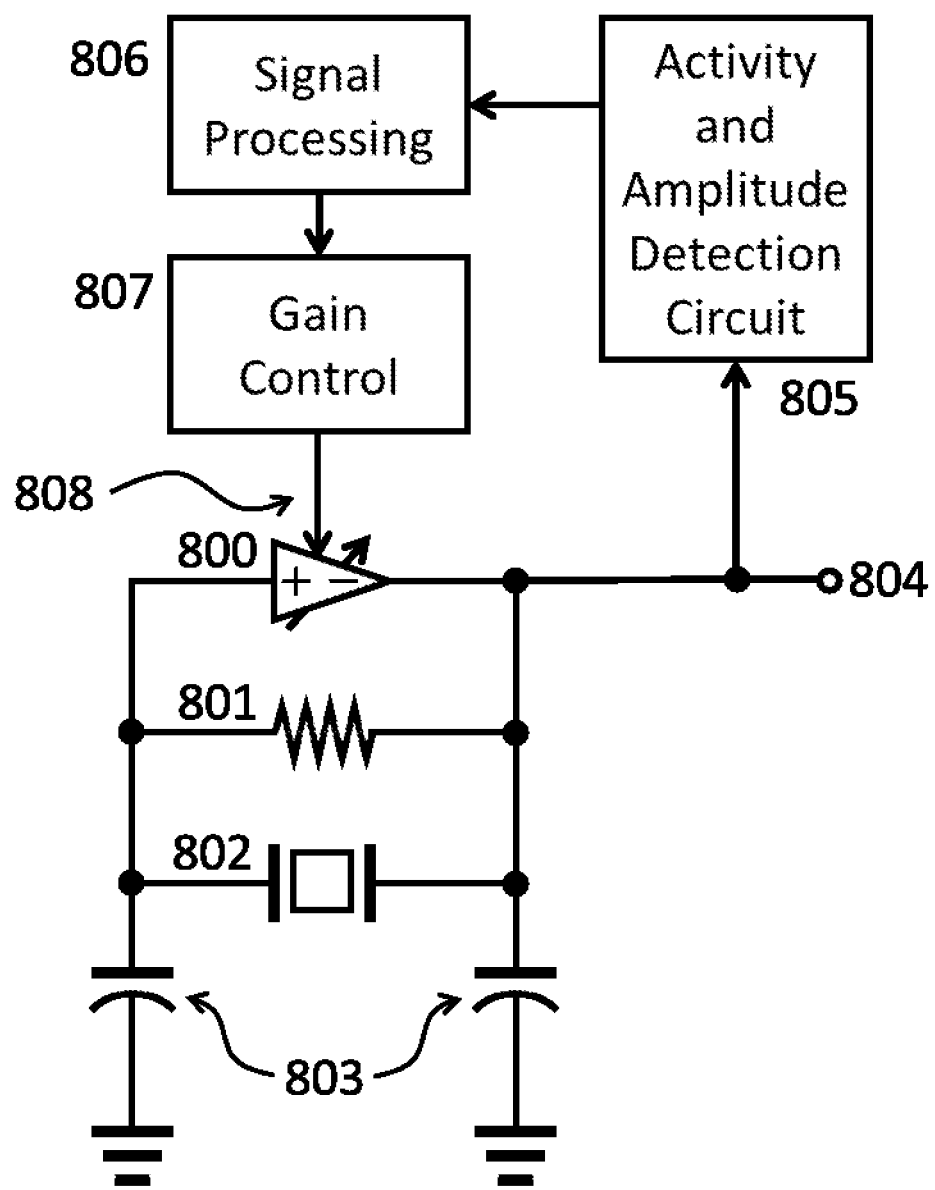

Figure 9 (Schematic diagram of a crystal oscillator comprising a start-up shortening technique, according to prior art)
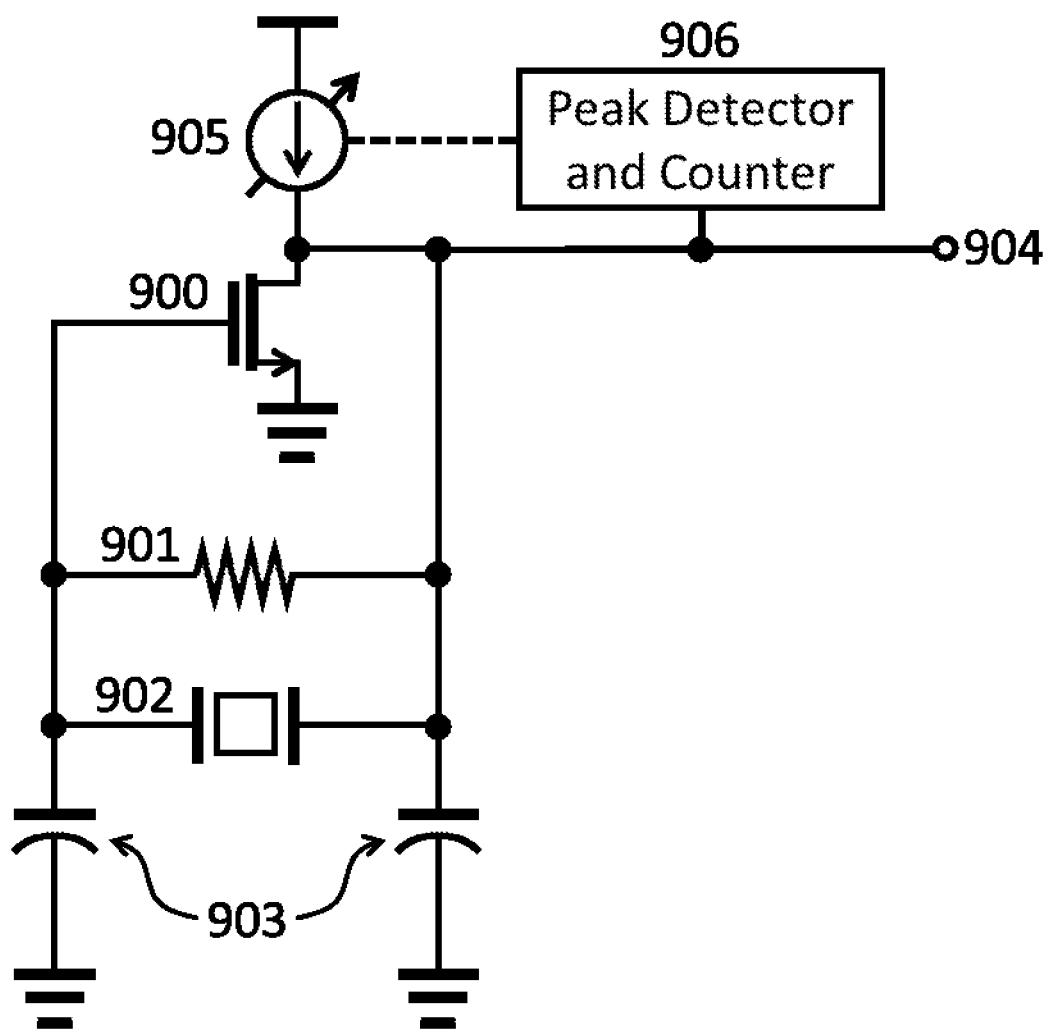

Figure 10 (Schematic diagram of a crystal oscillator comprising a start-up shortening technique, according to the present invention)
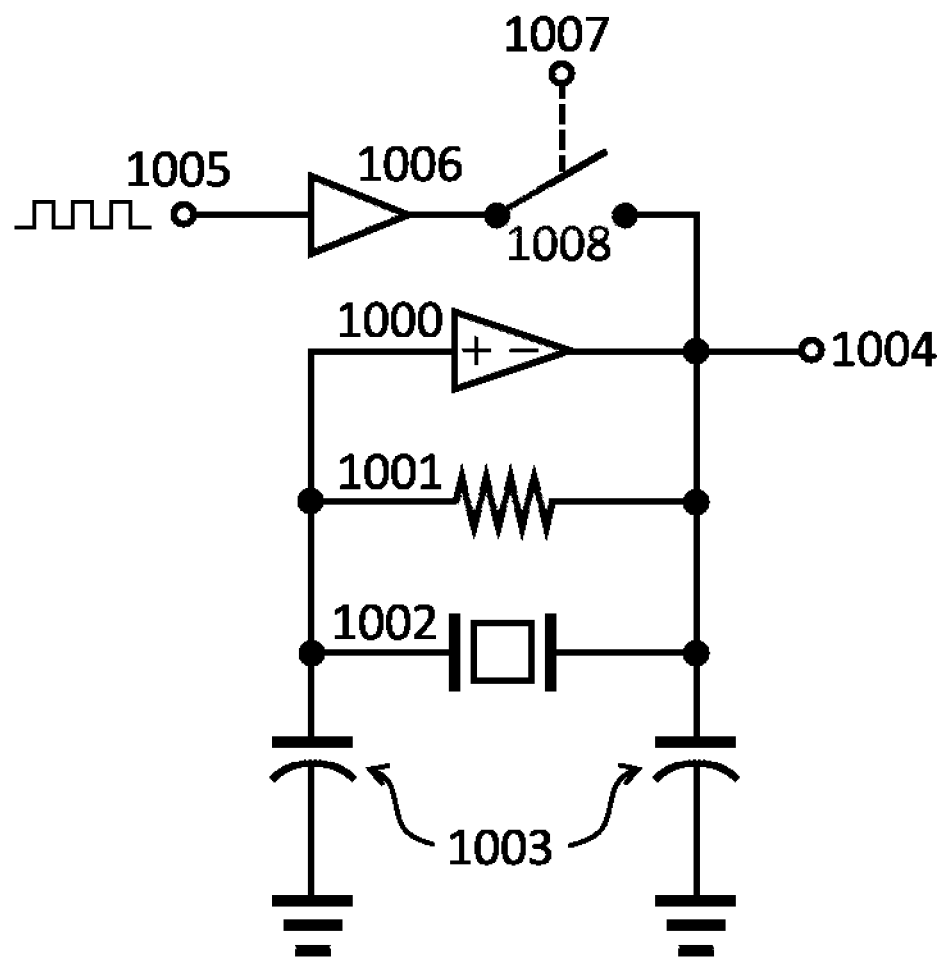

Figure 11 (Embodiment of the present invention, at which the start-up stimulus is realised as a time-variant current pattern)
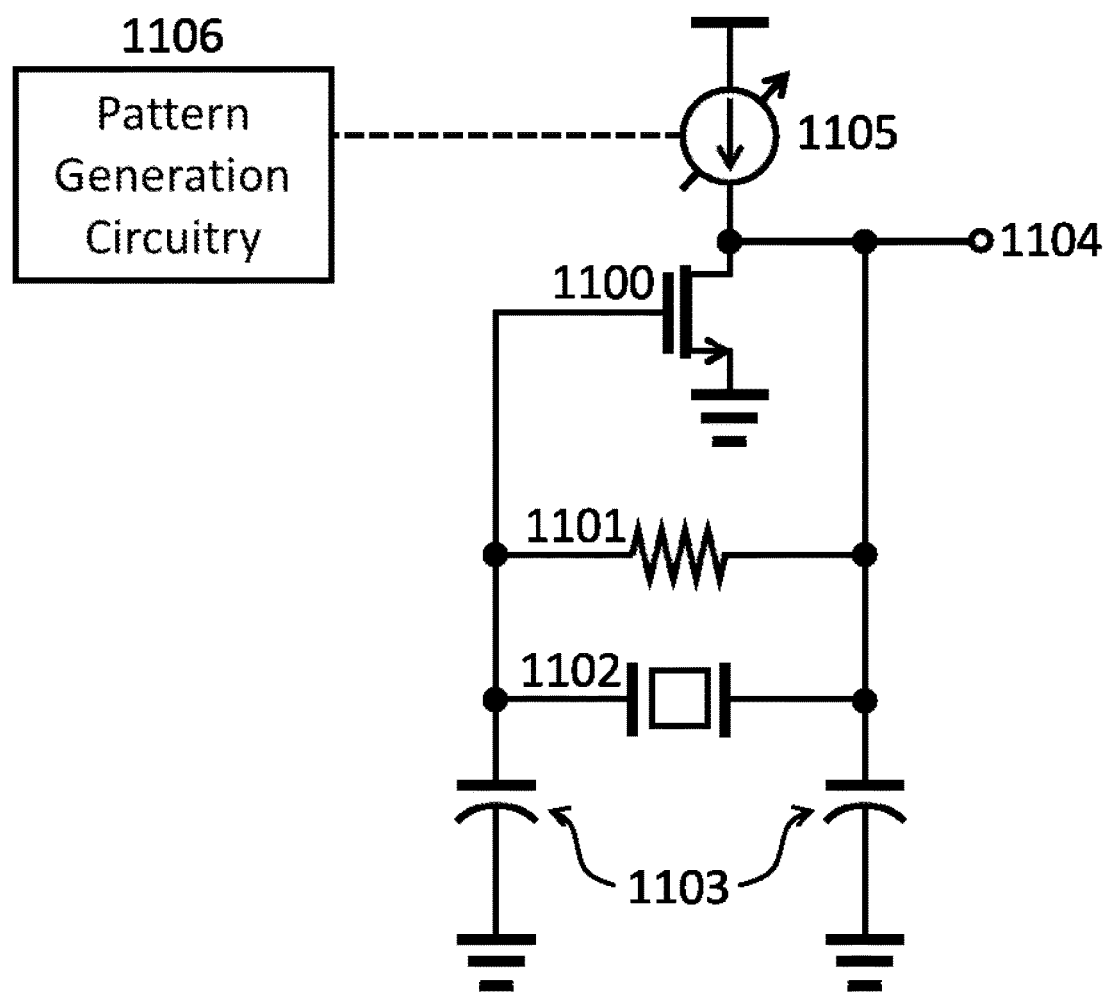

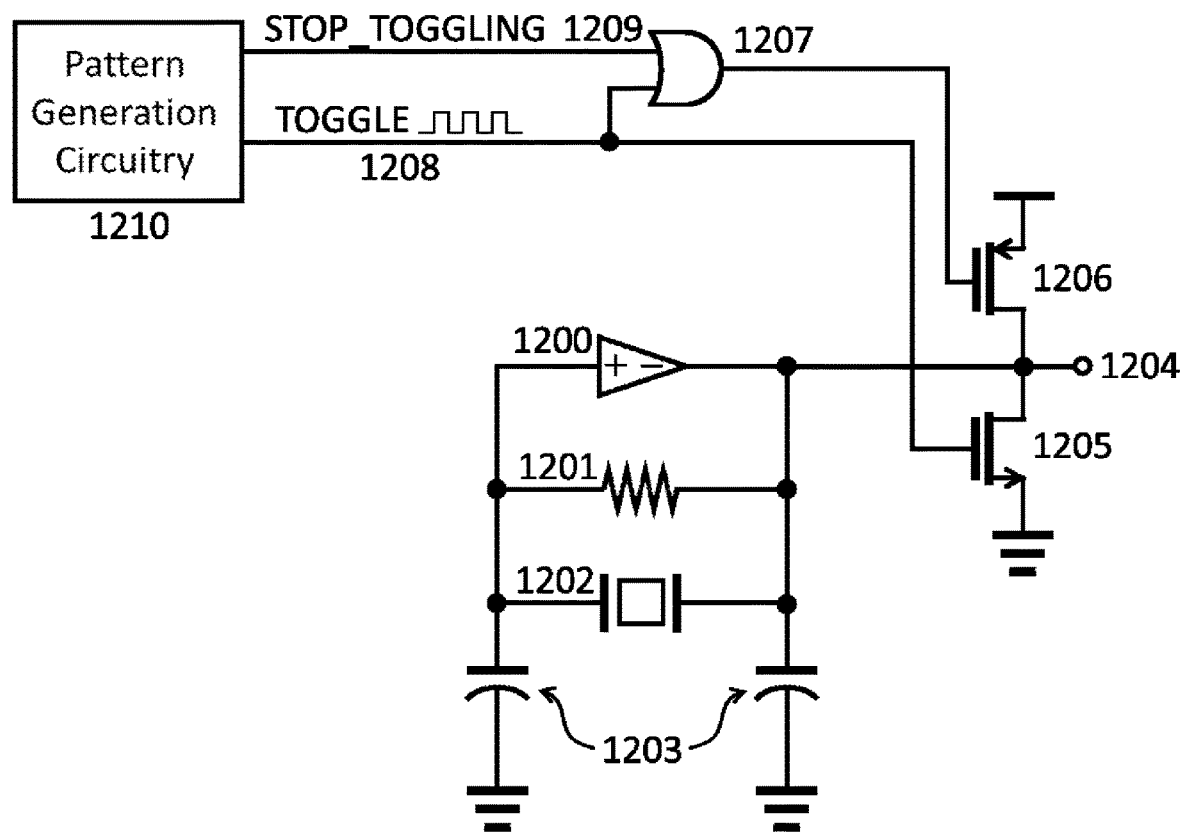
Figure 12 (Embodiment of the present invention, at which the start-up stimulus is realised as a time-variant voltage pattern)

FAST START-UP CIRCUIT FOR LOW POWER CRYSTAL OSCILLATOR

FIELD OF THE INVENTION

The invention relates to crystal oscillator circuits and, more specifically, to minimising the time required for a crystal oscillator to start-up from idle or power down state to operating at its full amplitude and final frequency.

BACKGROUND OF THE INVENTION

A vast majority of today's electronic systems require a high precision frequency source to operate. Applications include, among others, communication systems, microprocessors, and audio and video devices. As the internet of things market emerges, more and more battery-operated devices are required to interface with the infrastructure of the internet of things. For instance, wearables, mobile phones, medical devices and isolated sensors. A high precision low power frequency source is required to march these devices at their correct pace.

A widespread type of low power frequency source is the crystal oscillator. It consists of a piezoelectric crystal and an inverting amplifier, connected to each other to form a negative feedback loop. At a certain frequency range—a very narrow range—the feedback becomes positive and the circuit oscillates at a frequency within the range.

The piezoelectric crystal tends to mechanically vibrate at a certain frequency. The vibrations are accompanied by vibrations in the electrical voltage across the crystal nodes. The relation between these mechanical and electrical vibrations is bidirectional, that is, mechanical vibrations result in voltage vibrations and vice versa.

When a crystal is vibrating it has kinetic energy. The vibrations therefore decay as time goes by due to energy loss. To keep the crystal vibrating an energy source must introduce energy to the crystal. In a crystal oscillator, the amplifier is the energy source that keeps the crystal vibrating, and consequently, the oscillator's output voltage oscillating.

Right after powering up a crystal oscillator the crystal has no energy and does not vibrate. In practice, however, noise always exists in the oscillator, in particular a noise voltage between the crystal nodes. This noise is amplified by the feedback loop forming the oscillator at a frequency at which the feedback is positive. The crystal vibration and oscillator's output oscillation become stronger and stronger until the amplifier reaches saturation and it cannot add energy to the oscillator. From that point on the oscillator continues to oscillate in its steady state.

The aforementioned process taking place at power up is called the oscillator's start-up. It consists of energy build up by means of a positive feedback mechanism, a behaviour usually referred to as regeneration. As regeneration processes are slow in nature, it may take a long time—up to several seconds—for a crystal oscillator to start-up. Furthermore, since many crystal oscillators operate under low power conditions, the amplifier cannot introduce a lot of energy to the crystal in a short time. This increases the start-up time even more.

Shortening start-up time is vital to achieve a reasonable power up or wake up time of devices. It can be done by inserting a lot of energy to the crystal during start-up—a process that requires high power consumption—and then switching to normal operating mode for better power efficiency. Moreover, in low energy devices, e.g. battery-operated devices, where power efficiency is critical, start-up time should be as short as possible to minimise battery drain by the power consuming start-up process.

PRIOR ART

Various methods and implementations for shortening the start-up process of crystal oscillators have been introduced in prior art. The main differences between the prior art and this invention are:

1. In this invention, the stimulus used for inserting energy into the crystal during start-up is time-variant and may have either periodic or aperiodic pattern.
2. In this invention, the stimulus used for inserting energy into the crystal during start-up is time-variant and does not rely on detection of signal strength.

A basic crystal oscillator is shown in FIG. 1. It consists of a piezoelectric crystal (102 in FIG. 1) and an inverting amplifier (100 in FIG. 1) connected to each other in a feedback fashion. Additional shunt capacitors (103 in FIG. 1), that also belong to the feedback network along with the crystal, are connected to the crystal nodes to enable oscillation and stabilise the oscillation frequency. A resistor (101 in FIG. 1) often shunts the amplifier to set the DC operating point of the amplifier. The oscillator's output (104 in FIG. 1) is taken from the output node of the amplifier. The topology of FIG. 1 is referred to as "Pierce crystal oscillator", or, in short, "Pierce oscillator". Additional topologies, known to a person skilled in the art, are the so-called "Colpitts oscillator" and "Santos oscillator" (Shown in FIG. 2 and FIG. 3, respectively). The topologies differ from each other by the arrangement of the crystal and the capacitors inside the feedback network. Neither of these oscillators include any means for speeding up the start-up process. The present invention, as well as all the prior art mentioned here, consist of the Pierce oscillator and comprise additional apparatus for speeding up the start-up process. The present invention, however, can be applied also to the Colpitts and Santos oscillators, and will be demonstrated on the Pierce oscillator for lucidity.

The prior art invention of U.S. Pat. No. 4,704,587 (illustrated in FIG. 4) uses an additional resistor (405 in FIG. 4) and a series switch (406 in FIG. 4) connected in parallel to the Pierce oscillator circuit (400-404 in FIG. 4). Here, the inverting amplifier (400 in FIG. 4) is realised as a complementary-MOS (CMOS) inverting logic gate. During normal operation, the switch is closed and the total resistance shunting the amplifier (400 in FIG. 4) is the constant resistance (401 in FIG. 4) connected in parallel with the switched resistance (405 in FIG. 4). During start-up, the switch opens leaving only the constant resistance to shunt the amplifier. After a pre-determined period, the oscillator switches to normal mode. Although the higher resistance of the constant resistance alone degrades the noise performance of the oscillator (which is not of interest during start-up), is shortens start-up time to some extent. This invention is useful only for oscillators using small shunt resistance in normal operation. It makes use of a time-invariant, aperiodic change in the circuit during start-up. In addition, the start-up process still consists of noise amplification and energy build up due to positive feedback (regeneration), which is likely to be slow.

The prior art invention of U.S. Pat. No. 4,956,618 uses the realisation depicted in FIG. 5 as the amplifier (100 in FIG. 1) of the Pierce oscillator. The gain of the circuit is controlled by altering the current flowing through the n-channel and p-channel transistors (503 and 504 in FIG. 5, respectively)—the higher the current, the higher the gain. During normal operation, the switch (507 in FIG. 5) is open and the current flowing in the transistors (503, 504 in FIG. 5) is that of the constant current source (505 in FIG. 5). During start-up, the switch (507 in FIG. 5) is closed and the current flowing in the transistors is the sum of the constant and switched current sources (505 and 506 in FIG. 5, respectively). The oscillator switches to normal mode either after a pre-determined period or upon signalling from an oscillation detecting circuit. Despite the higher power consumption during start-up (which is usually not critical), start-up time is shortened significantly. This invention makes use of a time-invariant, aperiodic change in the circuit during start-up. In addition, the start-up process consists of noise amplification and energy build up due to positive feedback (regeneration), which still may be slow.

The prior art invention of U.S. Pat. No. 5,805,027 is shown in FIG. 6. Here, the amplifier (100 in FIG. 1) of the Pierce oscillator consists of a transistor connected in common source configuration (600 in FIG. 6) and loaded by a current source (608 in FIG. 6). The gain of the common source amplifier (600, 608 in FIG. 6) is controlled by altering the current flowing through the n-channel transistor (600 in FIG. 6)—the higher the current, the higher the gain. In addition, the shunt resistor (101 in FIG. 1) is replaced by the source-drain resistance of a transistor (601 in FIG. 6). During normal operation, the bias network (605 in FIG. 6) generates relatively low currents in the current sources (607, 608 in FIG. 6) to obtain oscillation and simultaneously consume low power. During start-up, a short pulse, generated by a pulse generator (606 in FIG. 6), is introduced to the bias network. As a result, the currents generated by the current sources increase considerably. This current impulse inserts kinetic energy to the crystal and shortens the start-up time. The oscillator switches to normal mode automatically right after the pulse. Even though power consumption is higher during start-up (which is usually not critical), start-up time is shortened significantly. This invention makes use of a one-off, patternless, aperiodic change in the circuit during start-up.

The prior art invention of U.S. Pat. No. 5,909,152 is illustrated in FIG. 7. On top of the amplifier (700 in FIG. 7) existing in every Pierce oscillator (100 in FIG. 1), it employs an additional switchable amplifier (707 in FIG. 7). During normal operation, the switches (708, 709 in FIG. 7) are open and the switched amplifier has no effect nor consumes any power. During start-up, the switches (708, 709 in FIG. 7) are closed and the switched amplifier comes into operation. The total gain of the two amplifiers (700, 707 in FIG. 7) connected in parallel is higher than the gain of the constant amplifier (700 in FIG. 7) solely, which boosts the regeneration process taking place at start-up. A Schmitt trigger (705 in FIG. 7) and an activity detection circuit (706 in FIG. 7) are used to switch the oscillator to normal mode. In spite of the higher power consumption during start-up (which is usually not critical), start-up time is shortened significantly. This invention makes use of a time-invariant, aperiodic change in the circuit during start-up. In addition, the start-up process consists of noise amplification and energy build up due to positive feedback (regeneration), which still may be slow.

Depicted in FIG. 8 is the prior art invention of U.S. Pat. No. 7,332,979B2. The amplifier (100 in FIG. 1) of the Pierce oscillator is realised as a variable-gain amplifier (VGA) (800 in FIG. 8). The gain of the VGA is controlled by an analogue input (808 in FIG. 8). Additional circuits of activity and amplitude detection (805 in FIG. 8), signal processing (806 in FIG. 8) and gain control (807 in FIG. 8), form an automatic gain control (AGC) over the VGA. During normal operation, the AGC (805, 806, 807 in FIG. 8) sets the gain of the VGA to be sufficient for stable oscillation and simultaneously power efficient. During start-up, the AGC enhances the gain of the VGA to boost the regeneration process. The oscillator switches to normal mode automatically by the AGC mechanism. Although power consumption is higher during start-up (which is usually not critical), start-up time is shortened significantly. This invention makes use of an aperiodic, patternless change in the circuit during start-up. In addition, the start-up process consists of noise amplification and energy build up due to positive feedback (regeneration), which still may be slow.

In the prior art invention of CN103117725A (shown in FIG. 9), the amplifier (100 in FIG. 1) of the Pierce oscillator consists of an n-channel transistor connected in common source configuration (900 in FIG. 9) and loaded by a programmable current source (905 in FIG. 9). The gain of the common source amplifier (900, 905 in FIG. 9) is controlled by altering the current flowing through the n-channel transistor—the higher the current, the higher the gain. Additional control circuit comprising a peak detector and a counter (906 in FIG. 9) is responsible of switching the oscillator from start-up mode to normal operation. During normal operation, the current generated by the current source and flowing in the n-channel transistor is relatively low, for power efficiency, but sufficient for stable oscillation. During start-up, the control circuit configures the current source to generate a higher current. Consequently, the gain of the common source amplifier increases, and the regeneration process speeds up. The oscillator switches to normal mode automatically by the control circuit. Although power consumption is higher during start-up (which is usually not critical), start-up time is shortened significantly. This invention makes use of a time-invariant, aperiodic change in the circuit during start-up. In addition, the start-up process consists of noise amplification and energy build up due to positive feedback (regeneration), which still may be slow.

BRIEF SUMMARY OF THE INVENTION

Illustrated in FIG. 10, the invention consists of the Pierce oscillator (1000 through 1004 in FIG. 10), with the addition of a circuit (1005 through 1008 in FIG. 10) for speeding up start-up.

During normal operation, the start-up circuit (1005 through 1008 in FIG. 10) is inactive and the circuit performs as a regular Pierce crystal oscillator. In FIG. 10, this is represented by opening the switch (1008 in FIG. 10).

During start-up, the start-up circuit (1005 through 1008 in FIG. 10) is active and introduces a time-variant, periodic or aperiodic, stimulus—either voltage or current—to the output of the oscillator (1004 in FIG. 10). The stimulus has a well-defined pattern. In FIG. 10, this is represented by closing the switch (1008 in FIG. 10).

For one embodiment of the invention, shown in FIG. 11, the amplifier (1000 in FIG. 10) is realised as a common source stage. A transistor (1100 in FIG. 11) is connected in common source configuration and loaded by a controllable current source (1105 in FIG. 11). The control over the current source may be digital or analogue, and is carried out by a current pattern and bias generator (1106 in FIG. 11) (hereinafter "the bias generator"). During normal operation, the bias generator configures the controllable current source to a low current, which is sufficient for stable oscillation and simultaneously power efficient. During start-up, the bias generator alters the current of the controllable current source in a time-variant pattern, either periodic or aperiodic. As a result, the voltage at the oscillator's output (1104 in FIG. 11) toggles up and down. This action introduces kinetic and electrical energy to the crystal (1102 in FIG. 11), which in turn speeds up the start-up process. The oscillator switches to normal mode after a pre-established period.

An additional embodiment of the invention is shown in FIG. 12. The amplifier (1200 in FIG. 12) can be realised either as a common source stage or as a complementary-MOS (CMOS) inverting logic gate. An n-channel transistor (1205 in FIG. 12) and a p-channel transistor (1206 in FIG. 12) are connected in parallel to the amplifier (1200 in FIG. 12), that is, their drain nodes are connected to the amplifier's output and their gates are separated from each other. During normal operation, signal TOGGLE (1208 in FIG. 12) is reset to logic '0' and signal STOP_TOGGLING (1209 in FIG. 12) is set to logic '1' by the pattern controller (1210 in FIG. 12). In this state, both transistors (1205, 1206 in FIG. 12) are inactive and have no effect on the oscillator's behaviour. During start-up, the pattern controller resets signal STOP_TOGGLING to logic '0' and toggles signal TOGGLE in a certain pattern, either periodic or aperiodic. Due to the OR logic gate (1207 in FIG. 12) the value of TOGGLE signal is introduced also to the gate of the p-channel transistor. As a result, the voltage at the oscillator's output (1204 in FIG. 12) toggles up and down. This action introduces kinetic and electrical energy to the crystal (1202 in FIG. 12), which in turn speeds up the start-up process. The oscillator switches to normal mode after a pre-established period.

BRIEF DESCRIPTIONS OF THE DRAWINGS

The invention may be understood by referring to the following description and accompanying drawings that are used to illustrate embodiments of the invention. In the drawings:

FIG. 1 is a schematic diagram of the Pierce crystal oscillator, according to prior art.

FIG. 2 is a schematic diagram of the Colpitts crystal oscillator, according to prior art.

FIG. 3 is a schematic diagram of the Santos crystal oscillator, according to prior art.

FIG. 4 is a schematic diagram of a crystal oscillator comprising a start-up shortening technique, according to prior art.

FIG. 5 is a schematic diagram of an amplifier serving in a crystal oscillator comprising a start-up shortening technique, according to prior art.

FIG. 6 is a schematic diagram of a crystal oscillator comprising a start-up shortening technique, according to prior art.

FIG. 7 is a schematic diagram of a crystal oscillator comprising a start-up shortening technique, according to prior art.

FIG. 8 is a schematic diagram of a crystal oscillator comprising a start-up shortening technique, according to prior art.

FIG. 9 is a schematic diagram of a crystal oscillator comprising a start-up shortening technique, according to prior art.

FIG. 10 is a schematic diagram of a crystal oscillator comprising a start-up shortening technique, according to the present invention.

FIG. 11 is an embodiment of the present invention, at which the start-up stimulus is realised as a time-variant current pattern.

FIG. 12 is an embodiment of the present invention, at which the start-up stimulus is realised as a time-variant voltage pattern.

DETAILED DESCRIPTION OF THE INVENTION

The present invention includes a method and apparatus for speeding up the start-up process of a crystal oscillator. The energy required for starting oscillations is inserted to the crystal by a stimulus in the form of a time-variant voltage or current pattern, either periodic or aperiodic. The stimulus is stopped after a pre-established period, then the oscillator continues to operate in its normal mode, swiftly completing the start-up process and proceeding to routine oscillation.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

For one embodiment of the invention, a crystal oscillator circuit is realised in the Pierce topology (FIG. 1), known to a person skilled in the art.

For another embodiment of the invention, a crystal oscillator circuit is realised in the Colpitts topology (FIG. 2), known to a person skilled in the art.

For another embodiment of the invention, a crystal oscillator circuit is realised in the Santos topology (FIG. 3), known to a person skilled in the art.

For another embodiment of the invention, an amplifier inside the crystal oscillator circuit is realised as a common source amplification stage (1100 in FIG. 11) loaded by a current source (1105 in FIG. 11).

For another embodiment of the invention, an amplifier inside the crystal oscillator comprises a controllable current source (1105 in FIG. 11). Control over the current source may be digital or analogue, and is carried out by a pattern generation circuitry (1106 in FIG. 11).

For another embodiment of the invention, a method is proposed to speed up the start-up time of a crystal oscillator by altering a controllable current source (1105 in FIG. 11) in a certain time-variant pattern.

For another embodiment of the invention, a method is proposed to speed up the start-up time of a crystal oscillator by altering a controllable current source (1105 in FIG. 11) in a periodic pattern.

For another embodiment of the invention, a method is proposed to speed up the start-up time of a crystal oscillator by altering a controllable current source (1105 in FIG. 11) in a periodic pattern that its spectral content includes a frequency, or plurality of frequencies, close or identical to the natural oscillation frequency of the crystal.

For another embodiment of the invention, an amplifier inside the crystal oscillator circuit (1200 in FIG. 12) is realised either as a common source stage or as a complementary-MOS (CMOS) logic gate.

For another embodiment of the invention, a circuitry inside the crystal oscillator comprises an n-channel transistor (1205 in FIG. 12) and a p-channel transistor (1206 in FIG. 12). A pattern generation circuitry (1210 in FIG. 12) sets the gate voltages of the transistors (1205, 1206 in FIG. 12) by means of an appropriate logic circuitry (1207 through 1209 in FIG. 12).

For another embodiment of the invention, a method is proposed to speed up the start-up time of a crystal oscillator by altering a signal or plurality of signals (1208, 1209 in FIG. 12) to open and close a transistor or plurality of transistors (1205, 1206 in FIG. 12) in a certain time-variant pattern.

For another embodiment of the invention, a method is proposed to speed up the start-up time of a crystal oscillator by altering a signal or plurality of signals (1208, 1209 in FIG. 12) to open and close a transistor or plurality of transistors (1205, 1206 in FIG. 12) in a periodic pattern.

For another embodiment of the invention, a method is proposed to speed up the start-up time of a crystal oscillator by altering a signal or plurality of signals (1208, 1209 in FIG. 12) to open and close a transistor or plurality of transistors (1205, 1206 in FIG. 12) in a periodic pattern that its spectral content includes a frequency, or plurality of frequencies, close or identical to the natural oscillation frequency of the crystal.

Advantages of the Invented Embodiments

In the current invention, the start-up process consists of a time-variant stimulus that actively inserts energy to the crystal. It does not consist of noise amplification and energy build up due to positive feedback (regeneration), which is slow. Hence, the current invention achieves faster start-up time compared to regeneration-based techniques.

In the current invention, the spectral content of the stimulus may include a frequency, or plurality of frequencies, close or identical to the natural oscillation frequency of the crystal. Such a stimulus speeds up the start-up process even faster.

In the current invention, the topology of the oscillator and the amplifier remains unchanged during normal operation. Any additional circuitry responsible of start-up boosting, if exists, is neutralised and/or disconnected during normal operation.

What we claim is:

1. An electronic circuit, comprising:
a fast start-up circuit for purpose of speeding up a start-up of a crystal oscillators;
an amplifier comprising a common source amplification stage biased by a controllable current source;
a piezoelectric crystal and capacitors connected as a feedback network between the-output and the input of the amplifier in a manner that forms a crystal oscillator;
a circuitry that can alter the current flowing in a said amplifier;
a start-up pattern consisting of a time-variant stimulus that actively varies the current flowing in a said amplifier and thus inserts energy to the crystal;
wherein the spectral content of the time-variant pattern includes a frequency, or plurality of frequencies, close or identical to the natural oscillation frequency of the crystal;
a start-up pattern which doesn't require a monitor or detection of a signal strength.

2. The circuit from claim 1, wherein the piezoelectric crystal and the capacitors are connected as a feedback network in a manner that forms a Pierce crystal oscillator.

3. The circuit from claim 1, wherein the piezoelectric crystal and the capacitors are connected as a feedback network in a manner that forms a Colpitts crystal oscillator.

4. The circuit from claim 1, wherein the piezoelectric crystal and the capacitors are connected as a feedback network in a manner that forms a Santos crystal oscillator.

5. The circuit from claim 1, wherein a resistor is connected between the input and the output of the amplifier.

6. The circuit from claim 1, wherein the control of the controllable current source comprises an analogue control.

7. The circuit from claim 1, wherein the control of the controllable current source comprises a digital control.

8. The circuit of claim 1, wherein the time-variant pattern is periodic.

9. An electronic circuit, comprising:
a fast start-up circuit for purpose of speeding up a start-up of a crystal oscillator;
an inverting amplifier;
a piezoelectric crystal and capacitors connected as a feedback network between the output and the input of the amplifier in a manner that forms a crystal oscillator;
a circuitry connected to the output of the amplifier that can alter the voltage at the output of a said amplifier;
a start-up pattern consisting of a time-variant stimulus that actively varies the voltage at the output of a said amplifier and thus inserts energy to the crystal;
wherein the spectral content of the time-variant pattern includes a frequency, or plurality of frequencies, close or identical to the natural oscillation frequency of the crystal;
a start-up pattern which doesn't require a monitor or detection of a signal strength;
a pair of power supply terminals for connection to the positive and negative voltages of a power source.

10. The circuit from claim 9, wherein the piezoelectric crystal and the capacitors are connected as a feedback network in a manner that forms a Pierce crystal oscillator.

11. The circuit from claim 9, wherein the piezoelectric crystal and the capacitors are connected as a feedback network in a manner that forms a Colpitts crystal oscillator.

12. The circuit from claim 9, wherein the piezoelectric crystal and the capacitors are connected as a feedback network in a manner that forms a Santos crystal oscillator.

13. The circuit from claim 9, wherein a resistor is connected between the input and the output of the amplifier.

14. The circuit from claim 9, wherein the amplifier is realised as a common source stage.

15. The circuit from claim 9, wherein the amplifier is realised as a complementary-MOS (CMOS) logic gate.

16. The circuit from claim 9, wherein the circuitry that can alter the voltage at the output of the said amplifier consists of an n-channel transistor and a p-channel transistor, the drain nodes of both transistors are connected to the output of the amplifier, the source node of the n-channel transistor is connected to the negative supply terminal, the source node of the p-channel transistor is connected to the positive supply terminal, and the gate nodes of the n-channel and the p-channel transistors are connected to a circuitry that can generate a time-variant pattern.

17. The circuit of claim 9, wherein the time-variant pattern is periodic.

* * * * *